(12) United States Patent
Kim et al.

(10) Patent No.: US 8,540,854 B2
(45) Date of Patent: Sep. 24, 2013

(54) APPARATUS AND METHOD FOR PLATING SUBSTRATE

(75) Inventors: Yijung Kim, Seoul (KR); Eun Su Rho, Cheonan-si (KR); Jeong Yong Bae, Cheonan-si (KR)

(73) Assignee: Semes Co., Ltd., Chungcheongnam (KR)

( * ) Notice: Subject to any disclaimer, the term of this patent is extended or adjusted under 35 U.S.C. 154(b) by 444 days.

(21) Appl. No.: 12/656,683

(22) Filed: Feb. 12, 2010

(65) Prior Publication Data

US 2010/0200397 A1  Aug. 12, 2010

(30) Foreign Application Priority Data

Feb. 11, 2009  (KR) .................... 10-2009-0011126

(51) Int. Cl.
  *C25D 5/08*  (2006.01)
  *C25D 7/12*  (2006.01)
  *C25D 11/32*  (2006.01)

(52) U.S. Cl.
  USPC ............ 204/237; 208/148; 208/157; 208/291

(58) Field of Classification Search
  USPC .......... 205/143, 148, 157, 291–298; 204/237
  See application file for complete search history.

(56) References Cited

U.S. PATENT DOCUMENTS

| | | | |
|---|---|---|---|
| 6,299,751 B1* | 10/2001 | Kaufman et al. | 205/148 |
| 6,558,518 B1 | 5/2003 | Sendai et al. | |
| 6,964,792 B1 | 11/2005 | Mayer | |
| 2002/0011417 A1* | 1/2002 | Talieh et al. | 205/157 |
| 2002/0029961 A1* | 3/2002 | Dordi et al. | 204/198 |
| 2002/0125141 A1* | 9/2002 | Wilson et al. | 205/96 |
| 2003/0010626 A1* | 1/2003 | Gramarossa et al. | 204/202 |
| 2003/0085115 A1* | 5/2003 | Tani et al. | 204/192.13 |
| 2004/0134775 A1* | 7/2004 | Yang et al. | 204/296 |
| 2004/0231997 A1* | 11/2004 | Wang et al. | 205/143 |
| 2005/0092614 A1* | 5/2005 | Gallina | 205/157 |

FOREIGN PATENT DOCUMENTS

| | | |
|---|---|---|
| JP | 10-053892 | 2/1998 |
| KR | 10-0637890 | 10/2006 |

* cited by examiner

*Primary Examiner* — Nicholas A Smith
*Assistant Examiner* — Ciel Thomas
(74) *Attorney, Agent, or Firm* — Harness, Dickey & Pierce P.L.C.

(57) ABSTRACT

Provided are a substrate plating apparatus and a substrate plating method. In the substrate plating apparatus, a substrate support member supports a substrate to allow a plating surface to look up. A plating solution containing positive ions dissolved from a positive electrode is supplied from a plating solution supply member onto the substrate at an upper side of the substrate support member. A plating bath surrounds the substrate support member. The substrate support member is rotated in a state where it is immersed into the plating solution and an additive. The substrate can be supported by the substrate support member without reversing the substrate. Also, a pattern defect due to bubbles generated during a plating process can be prevented.

18 Claims, 13 Drawing Sheets

APPARATUS AND METHOD FOR PLATING SUBSTRATE

CROSS-REFERENCE TO RELATED APPLICATIONS

This U.S. non-provisional patent application claims priority under 35 U.S.C. § 119 of Korean Patent Application No. 10-2009-0011126, filed on Feb. 11, 2009, the entire contents of which are hereby incorporated by reference.

BACKGROUND

The present disclosure herein relates to an apparatus and method for plating a substrate, and more particularly, to a substrate plating apparatus and method for performing a metal plating process on a semiconductor substrate.

Copper (Cu) having low electrical resistance and high electromigration resistance than those of aluminium (Al) or an Al alloy is used in recent years as a material for forming an interconnection circuit on a semiconductor substrate. Generally, Cu is filled into an interconnection pattern trench formed in a surface of the substrate to form a Cu interconnection. Various techniques for forming the Cu interconnection are known. For example, the techniques may include chemical vapor deposition (CVD), sputtering, plating, etc. However, the CVD process requires relatively high manufacturing costs when the Cu interconnection is formed. Also, according to the sputtering process, it is difficult to fill Cu or its alloy into the interconnection pattern trench in case where the interconnection pattern trench has a high aspect ratio. On the other hand, the plating process has improved efficiency because Cu or its alloy is deposited on the substrate to form the Cu interconnection.

FIG. 1A is a schematic view of a typical substrate plating apparatus. FIG. 1B is an enlarged view illustrating a portion "a" of FIG. 1A. As illustrated in FIG. 1A, a typical substrate plating apparatus 10 includes a substrate support member 11 supporting a substrate W to allow a surface to be plated (hereinafter, referred to as a plating surface) of the substrate W to look down and a plating bath 15 disposed below the substrate support member 11 and including a positive electrode 12 and an ion exchange membrane 13. The substrate W is supported by the substrate support member 11 to allow the plating surface to look down and is immersed into a plating solution.

According to the typical substrate plating apparatus 10, since the substrate W transferred in a state in which the plating surface looks up should be reversed to allow the plating surface to look down in order that the substrate W is supported by the substrate support member 11, a separate unit for reversing the substrate W is required. Also, as illustrated in FIG. 1B, due to a chemical reaction during the plating process or the rotation of the substrate support member 11, bubbles 27 may occur in the plating solution. Thus, the generated bubbles 27 rise up by buoyancy to stay on a contact hole 25 for interconnection or a trench 26. If the bubbles 27 staying on the contact hole 25 for interconnection or the trench 26 are not removed, a defect pattern of the substrate W may occur during the plating process.

SUMMARY

The present disclosure provides a substrate plating apparatus in which a plating layer is uniformly deposited and a substrate plating method using the same.

The present disclosure also provides a substrate plating apparatus in which a plating process is performed without reversing a substrate during a substrate plating process and a substrate plating method using the same.

The present disclosure also provides a substrate plating apparatus having a simple structure.

The present disclosure also provides a substrate plating apparatus that prevents a plating defect occurring by bubbles and a substrate plating method using the same.

Embodiments of the inventive concept provide apparatuses for plating a substrate, the apparatuses including: a substrate support member; and a plating solution supply member disposed above the substrate support member, the plating solution supply member discharging a plating solution onto a plating surface of the substrate, wherein the substrate support member includes a support plate supporting the substrate to allow the plating surface to look up.

In some embodiments, the substrate support member may include an annular ring protruding annularly from a top surface of the support plate toward an upper side along an outer circumference of the support plate, the annular ring providing a space in which the substrate is disposed therein. The substrate support member may further include an injection nozzle passing through the support plate and injecting an inert gas onto a non-plated surface of the substrate.

In other embodiments, the support plate may have a vacuum suction hole vacuum-adsorbing a non-plated surface of the substrate to support the substrate.

In still other embodiments, the substrate support member may have a holes vertically passing through the support plate and may further include a support pin vertically movable along the respective holes and loading/unloading the substrate to/in the space. The apparatuses may further include a plating bath surrounding the substrate support member, the plating bath having an opened upper portion, wherein the plating path my have an upper end higher than a top surface of the annular ring.

In even other embodiments, the apparatuses may further include: a plating solution storage part storing the plating solution; a first supply line connecting the plating solution supply member to the plating solution storage part, the first supply line supplying the plating solution to the plating solution supply member; and a second supply line connecting the plating bath to the plating solution storage part, the second supply line supplying the plating solution to the plating bath.

In yet other embodiments, the plating solution supply member may have a bottom surface having a diameter greater than an inner diameter of the annular ring. The plating solution supply member may include: a main body having an inner space with opened lower portion; a positive electrode disposed in the inner space, the positive electrode providing positive ions into the plating solution; and an ion exchange membrane disposed below the positive electrode, the ion exchange membrane being permeable only to the positive ions. The plating solution supply member may be disposed below the ion exchange membrane and may further include a porous plate in which a plurality of holes is defined. The plating solution supply member may further include an interception plate opening and closing the plurality of holes.

In further embodiments, the apparatuses may further include a first driving part vertically moving the substrate support member or the plating solution supply member, the first driving part varying a relative distance between the substrate support member and the plating solution supply member.

In still further embodiments, the substrate support member may further include a metal pin disposed on an outer circumference of the support plate, the metal pin protruding upwardly from a top surface of the support plate, wherein the metal pin may contact the plating surface and be electrically connected to the substrate.

In even further embodiments, the substrate support member may further include a metal pin disposed on the outer circumference of the support plate, the metal pin protruding upwardly from the top surface of the support plate, wherein the metal pin may contact the plating surface and be electrically connected to the substrate. The metal pin may be disposed on the annular ring.

In yet further embodiments, the substrate support member may further include a reinforcement member surrounding an outer surface of the metal pin, the reinforcement member reinforcing strength of the metal pin. The reinforcement member may include a support member including a support member protruding upwardly from the top surface of the support plate and an upper member extending from an end of the support member in a direction different from that of the support member, wherein a groove may be defined in a lateral surface of the support member in a longitudinal direction, and the groove may extend along a bottom surface of the upper member, wherein the metal pin may be inserted into the groove.

In yet much further, the apparatuses may further include a second driving part rotating the metal pin. The apparatuses may further include a third driving part lifting the meal pin from the top surface of the support plate toward an upper side.

In other embodiments of the inventive concept, methods for plating a substrate include: supporting the substrate on a substrate support member to allow a plating surface of the substrate to look up; and discharging a plating solution from a plating solution supply member disposed above the substrate support member onto the plating surface, wherein the plating solution contains positive ions dissolved from a positive electrode disposed in an inner space of the plating solution supply member. The supporting of the substrate may include injecting an inert gas onto a non-plated surface of the substrate to space the substrate from the substrate support member, thereby supporting the substrate. The discharging of the plating solution may include rotating the substrate support member while the plating solution is discharged.

In some embodiments, the supporting of the substrate may include rotating a metal pin disposed on an outer circumference of the substrate support member and protruding upwardly from a top surface of the substrate support member to contact the substrate.

In other embodiments, the methods may further include supplying the plating solution to a plating bath surrounding the substrate support member and having an opened upper portion to immerse the substrate support member while the plating solution is discharged onto the plating surface.

In still other embodiments, the discharging of the plating solution may include: intercepting a plurality of holes defined in a bottom surface of the plating solution supply member to fill the plating solution into the inner space; allowing the positive ions to pass through ion exchange membrane disposed below the positive electrode; and opening the plurality of holes.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1A:
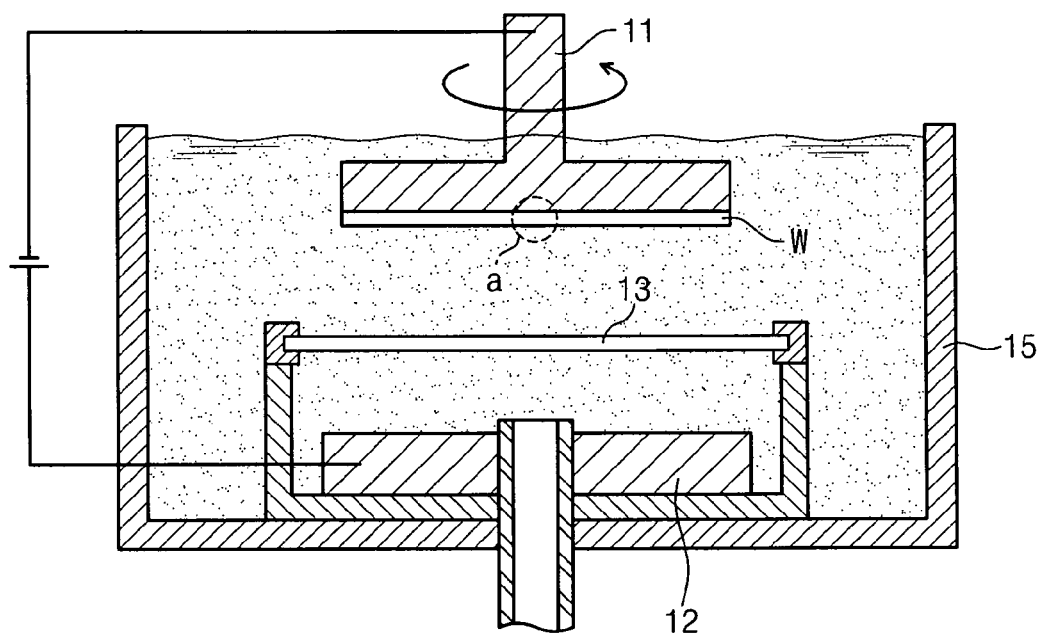
FIG. 1A is a schematic view of a typical substrate plating apparatus.

Exemplary embodiments of the inventive concept will be described below in more detail with reference to FIGS. 2A to 7D. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of layers and regions are exaggerated for clarity of illustration.

Figure 2A:
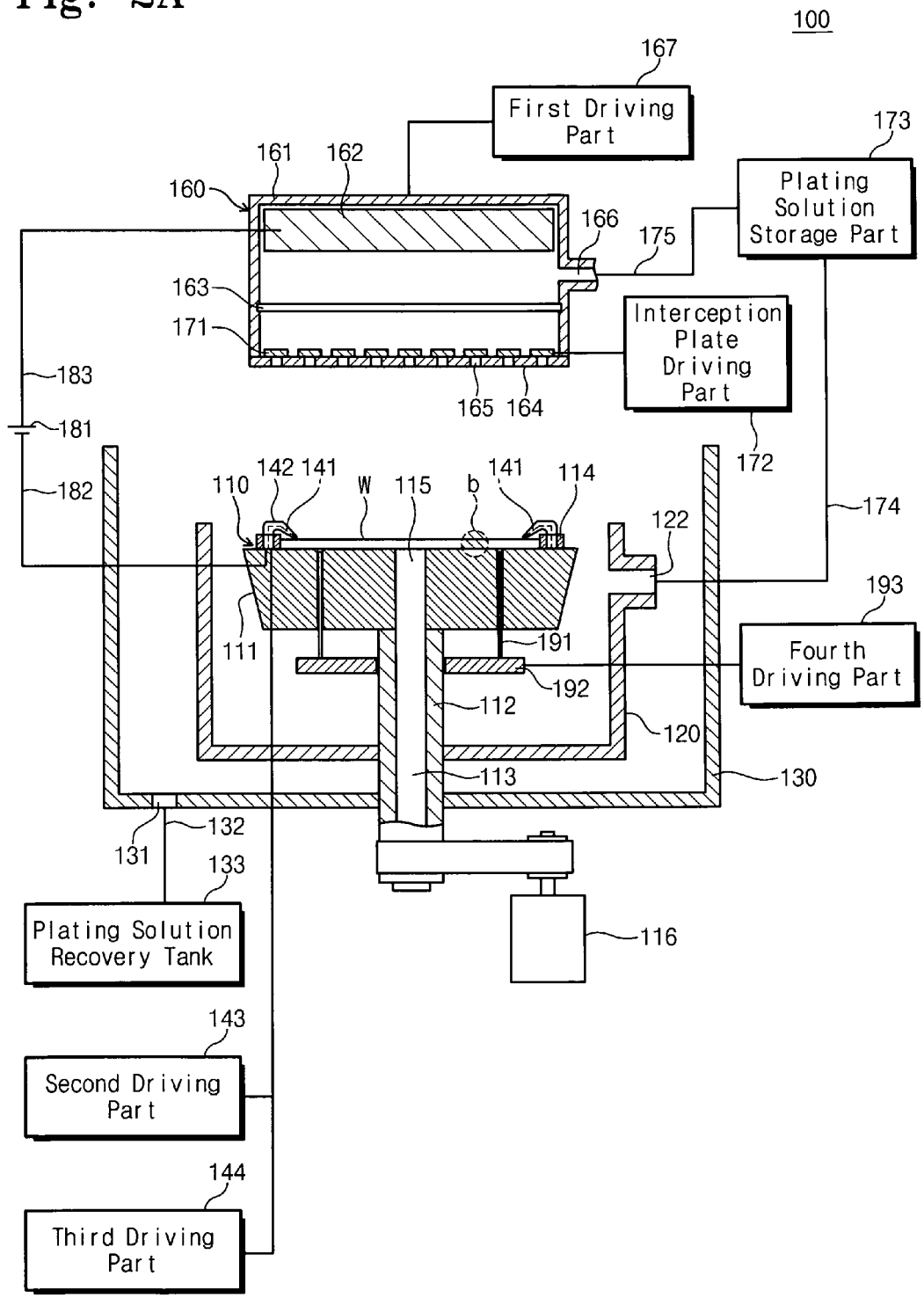
FIG. 2A is a schematic view of a substrate processing apparatus according to an embodiment of the inventive concept.

FIG. 2A is a schematic view of a substrate processing apparatus according to an embodiment of the inventive concept.

Referring to FIG. 2A, a substrate processing apparatus 100 includes a substrate support member 110, a plating bath 120, a bowl 130, and a plating solution supply member 160.

The substrate support member 110 supports a substrate W to allow a plating surface of the substrate W to look up. The plating bath 120 receives a plating solution and an additive to immerse the substrate support member 110. The bowl 130 surrounds the plating bath 120 and recovers the plating solution overflowing from the plating bath 120. The plating solution supply member 160 supplies the plating solution from an upper side of the substrate support member 110 to the plating surface of the substrate W. Hereinafter, each of the components will be described in detail.

The substrate support member 110 includes a support plate 111, a support shaft 112, an annular ring 114, a support plate driver 116, a metal pin 141, a reinforcement member 142, a support pin 191, and a base 192.

The support plate 111 has a circular plate shape. The support plate 111 has a top surface diameter greater than that of the substrate W and a bottom surface diameter less than the top surface diameter thereof. The support shaft 112 is coupled to a lower end of the support plate 111. The support plate 111 is supported by the support shaft 112 and rotatable by rotation of the support shaft 112. The support plate 111 supports the substrate W to allow the plating surface of the substrate W to look up. The substrate W transferred by a transfer unit (not shown) in a state in which the plating surface looks up is seated on the support pin 191 that stays at an upper side of the support plate 111. Then, when the support pin 191 descends, the substrate W is supported by the support plate 111 to allow the plating surface to look up. A vacuum suction hole 115 passing through the support plate 111 is defined in the support plate 111. The vacuum suction hole 115 vacuum-adsorbs a non-plated surface of the substrate W to support the substrate W. The vacuum suction hole 115 is connected to a suction member (not shown) for sucking air. A pump that can suck air may be used as the suction member. A plurality of holes vertically passing through the support plate is defined in the support plate 111. According to this embodiment, the plurality of holes is defined between the vacuum suction hole 115 and the annular ring 114. The plurality of holes serves as passages through which the support 191 ascends or descends.

The support shaft 112 has an inner space 113 and vertically opened cylindrical shape. The support shaft 112 is coupled to a lower end of the support plate 111. The inner space 113 of the support shaft 112 communicates with the vacuum suction hole 115 to provide a passage through which the sucked air is exhausted to the outside through the vacuum suction hole 115. The support plate driver 116 is disposed below the support shaft 112 to rotate the support plate 111 using a power supplied from an external power source.

The annular ring 114 has a ring shape annularly protruding from a top surface of the support plate 111 to an upper side along an outer circumference of the support plate 111. The annular ring 114 provides a space in which the substrate W is disposed therein. The annular ring 114 allows the plating solution supplied from the plating solution supply member 160 to stay therein, thereby providing a space in which a plating layer is deposited.

The metal pin 141 is disposed on the outer circumference of the support plate 111 and protrudes upwardly from a top surface of the support plate 111. According to this embodiment, the metal pin 141 may be disposed outside the annular ring 114 or on the annular ring 114. The metal pin 141 is inserted into a groove (see reference numeral 145 of FIG. 5C) defined in the reinforcement member 142. Specifically, the metal pin 141 is inserted into the groove (see reference numeral 145 of FIG. 5C) defined in a lateral surface of a support member (see reference numeral 142a of FIG. 5C) and a bottom surface of an upper member (see reference numeral 14b of FIG. 5C) in a longitudinal direction. The metal pin 141 is rotated by a second driving part 143 to contact the plating surface of the substrate W. The metal pin 141 may be electrically connected to the substrate W. The metal pin 141 includes a support rod (see reference numeral 141a of FIG. 5B) protruding upwardly from the top surface of the support plate 111 and a contact rod (see reference numeral 141b of FIG. 5B) inclined from an upper end of the support rod 141a and contacting the plating surface of the substrate W. The second driving part 143 rotates the metal pin 141. Specifically, the second driving part 143 rotates the metal pin 141 with respect to a line passing through a center of a longitudinal direction of the support rod 141a as an axis. A third driving part 144 lifts the metal pin 141 upwardly from the top surface of the support plate 111. The metal pin 141 may be provided in plurality. The plurality of metal pins 141 may be spaced apart from each other along the outer circumference of the support plate 111. The metal pins 141 are disposed with a predetermined distance therebetween.

The reinforcement member 142 surrounds the metal pin 141 to reinforce strength of the metal pin 141. The reinforcement member 142 includes the support member 142a protruding upwardly from the top surface of the support plate 111 and the upper member 142b extending from an end of the support member 142a in a direction different from that of the support member 142a. The groove 145 is defined in an outer surface of the reinforcement member 142 in a longitudinal direction of the support member 142a and the upper member 142b. The metal pin 141 is inserted into the groove 145 defined in the outer surface of the reinforcement member 142. Specifically, the support rod 141a is inserted into the groove 145 defined in the support member 142a, and the contact rod 141b is inserted into the groove 145 defined in the upper member 142b. The metal pin 141 inserted into the reinforcement member 142 has a surface exposed to the outside.

The plating bath 120 has an opened upper portion and surrounds the substrate support member 110. An under surface of the plating bath 120 is spaced apart from a bottom surface of the support plate 111. A sidewall of the plating bath 120 extends upwardly from an outer circumference end of the under surface thereof. According to this embodiment, an upper end of the sidewall of the plating bath 120 is higher than a top surface of the annular ring 114. Since the plating bath 120 has the upper end higher than the top surface of the annular ring 114, the substrate support member 110 is sufficiently immersed in the plating solution supplied into the plating bath 120. A first inflow hole 122 is defined in the sidewall of the plating bath 120. The first inflow hole 122 is connected to a first supply line 174 to provide a passage through which the plating solution stored in a plating solution storage part 173 is supplied into the plating bath 120 through the first supply line 174.

The bowl 130 surrounds the plating bath 120. The bowl 130 recovers the plating solution overflowing from the plating bath 120 and the plating solution dispersed by the rotation of the substrate support member 110. A drain 131 is defined in a bottom surface of the bowl 130. The drain 131 provides a passage through which the plating solution recovered within the bowl 130 is moved into a plating solution recovery tank 133 through a plating solution recovery line 132.

The support pin 191 is disposed in each of holes vertically passing through the support plate 111. The support pin 191 may be vertically movable along the hole. Also, the support pin 191 loads/unloads the substrate W to the space of the annular ring 114. The base 192 is disposed below the support plate 111 and coupled to a lower end of the support pin 191. A fourth driving part 193 vertically moves and rotates the base 192.

The plating solution supply member 160 is disposed above the substrate support member 110 to supply the plating solution to the plating surface of the substrate W. An under surface of the plating solution supply member 160 has a diameter greater than an inner diameter of the annular ring 114. The plating solution supply member 160 may be rotated by a first driving part 167.

The plating solution supply member 160 includes a main body 161, a positive electrode 162, an ion exchange membrane 163, a porous plate 164, and an interception plate 171. The main body 161 has a cylindrical shape and an opened lower portion. Also, the main body 161 has a space therein. The main body 161 has a diameter greater than the inner diameter of the annular ring 114. The positive electrode 162 is disposed in the inner space of the main body 161. The positive electrode 162 has a circular plate shape, and an outer surface thereof contacts an inner sidewall of the main body 161. The positive electrode 162 is electrically connected to the metal pin 141 through electric wires 182 and 183. A power source 181 is disposed on the electric wires 182 and 183. A first electric wire 182 connects the metal pin 141 to a negative pole of the power source 181, and a second electric wire 183 connects the positive electrode 162 to a positive pole of the power source 181. The ion exchange membrane 163 is disposed between the positive electrode 162 and the porous plate 164 within the inner space of the main body 161. The ion exchange membrane 163 is coupled to the inner sidewall of the main body 161 along a circumference direction of the main body 161. The ion exchange membrane 163 is permeable only to positive ions. According to this embodiment, a Cu plate is used as the positive electrode 162, and a copper sulfate solution ($CuSO_4$) is used as the plating solution. When a predetermined voltage is applied to the positive electrode 162, positive ions such as $Cu^{2+}$ is melted into the plating solution from the positive electrode 162. The $Cu^{2+}$ positive ions emitted from the positive electrode 162 pass through the ion exchange membrane 163. However, $SO_4^{2-}$ negative ions remaining in the plating solution does not pass through the ion exchange membrane 163. A second inflow hole 166 is defined in the sidewall of the main body 161. The second inflow hole 166 is connected to a second supply line 175 and provides a passage through which the plating solution stored in the plating solution storage part 173 is supplied into the main body 161 through the second supply line 175. Specifically, the second inflow hole 166 is defined between the positive electrode 162 and the ion exchange membrane 163.

The porous plate 164 has a circular plate shape and is disposed below the ion exchange membrane 163. Also, an outer circumference of the porous plate 164 is coupled to a lower end of the main body 161. A plurality of holes 165 is uniformly defined in the porous plate 174. The porous plate 164 interrupts an opened lower portion of the main body to store a certain amount of the plating solution within the inner space of the main body 161. The plating solution staying within the inner space of the main body 161 is uniformly supplied to an entire region of the plating surface through the holes 165 defined in the porous plate 164. The plurality of holes 165 is opened or closed by the interception plate 171. The interception plate 171 opens or closes the holes 165 by an interception plate driving part 172.

Figure 4A:
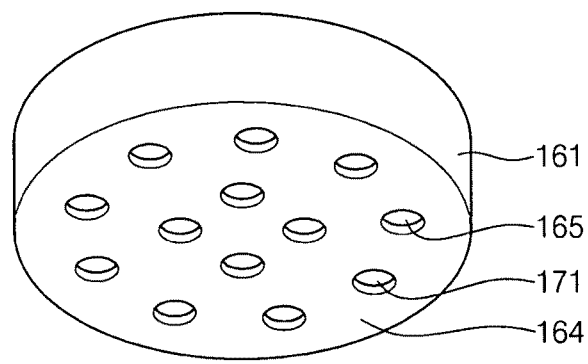
FIGS. 4A and 4B are perspective views of holes defined in a porous plate.
Figure 4B:
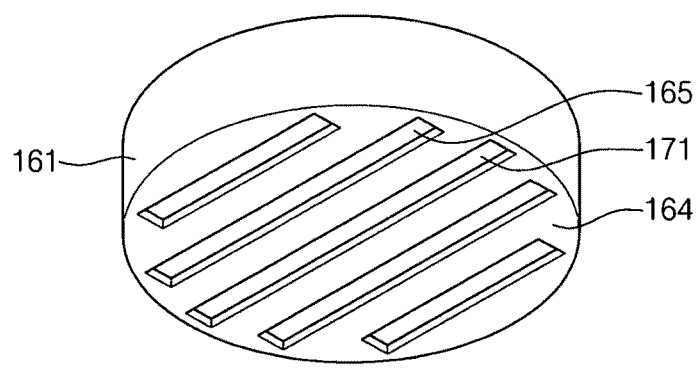

FIGS. 4A and 4B are perspective views of holes 165 defined in a porous plate 164. Referring to FIG. 4A, the respective holes 165 have a circular shape. Also, the holes 165 are uniformly defined in the porous plate 164. Referring to FIG. 4B, the respective holes 165 have a slit shape. Also, the holes 165 are spaced a predetermined distance from each other in a direction parallel to a diameter direction of the porous plate 164. A configuration of the respective holes 165 is not limited to the configuration described above, and is modified variously.

Figure 2B:
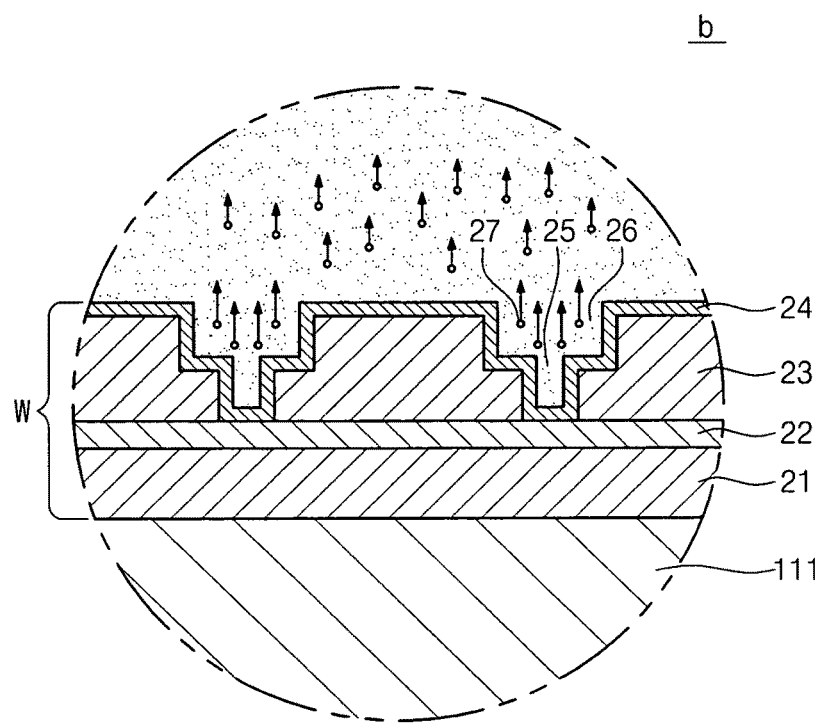
FIG. 2B is an enlarged view illustrating a portion "a" of FIG. 2A.

FIG. 2B is an enlarged view illustrating a portion "a" of FIG. 2A.

Figure 1B:
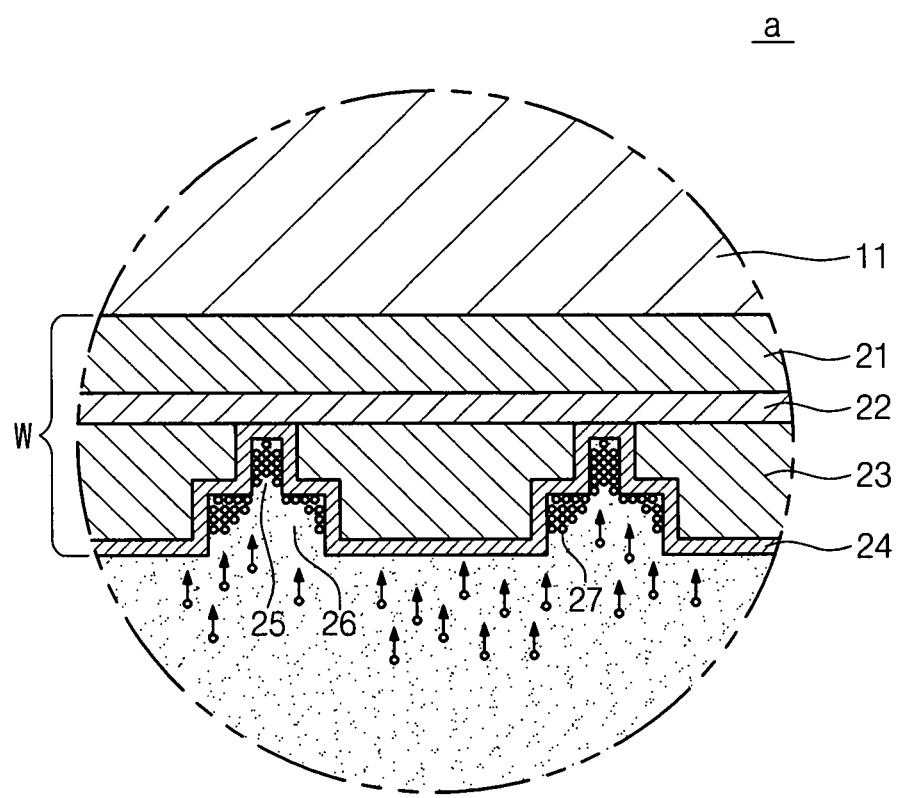
FIG. 1B is an enlarged view illustrating a portion "a" of FIG. 1A.

Referring to FIG. 2B, the substrate W is supported by the top surface of the support plate 111 to allow the plating surface to look up. According to this embodiment, a dielectric 23 formed of $SiO_2$ is deposited on a conductive layer 22 disposed on a semiconductor base 21. A contact hole 25 for interconnection and a trench 26 are defined within the dielectric 23 using a lithography/etching technique, and a seed layer 24 that is an electricity supply layer is disposed. To plate Cu on a surface of the seed layer 24, the plating solution is supplied to a top surface of the plating surface. While the plating process is performed, bubbles are generated on the plating solution due to due to a chemical reaction and the rotation of the immersed substrate support member 110. Like a typical technology, when the plating surface of the substrate is supported to look down (see FIG. 1B), the bubbles generated at a lower portion of the substrate W rise up by buoyancy. As a result, the bubbles are introduced into the contact hole 25 and trench 26 of the plating surface and stay therein. However, as described according to the inventive concept, when the plating surface of the substrate W is supported to look up, the generated bubbles 27 are released into air without introducing into the contact hole 25 and the trench 26 of the plating surface due to the buoyancy. Thus, since the bubbles 27 generated during the plating process do not stay on the plating surface, pattern defect of the substrate W due to the bubbles 27 may be prevented.

Figure 3:
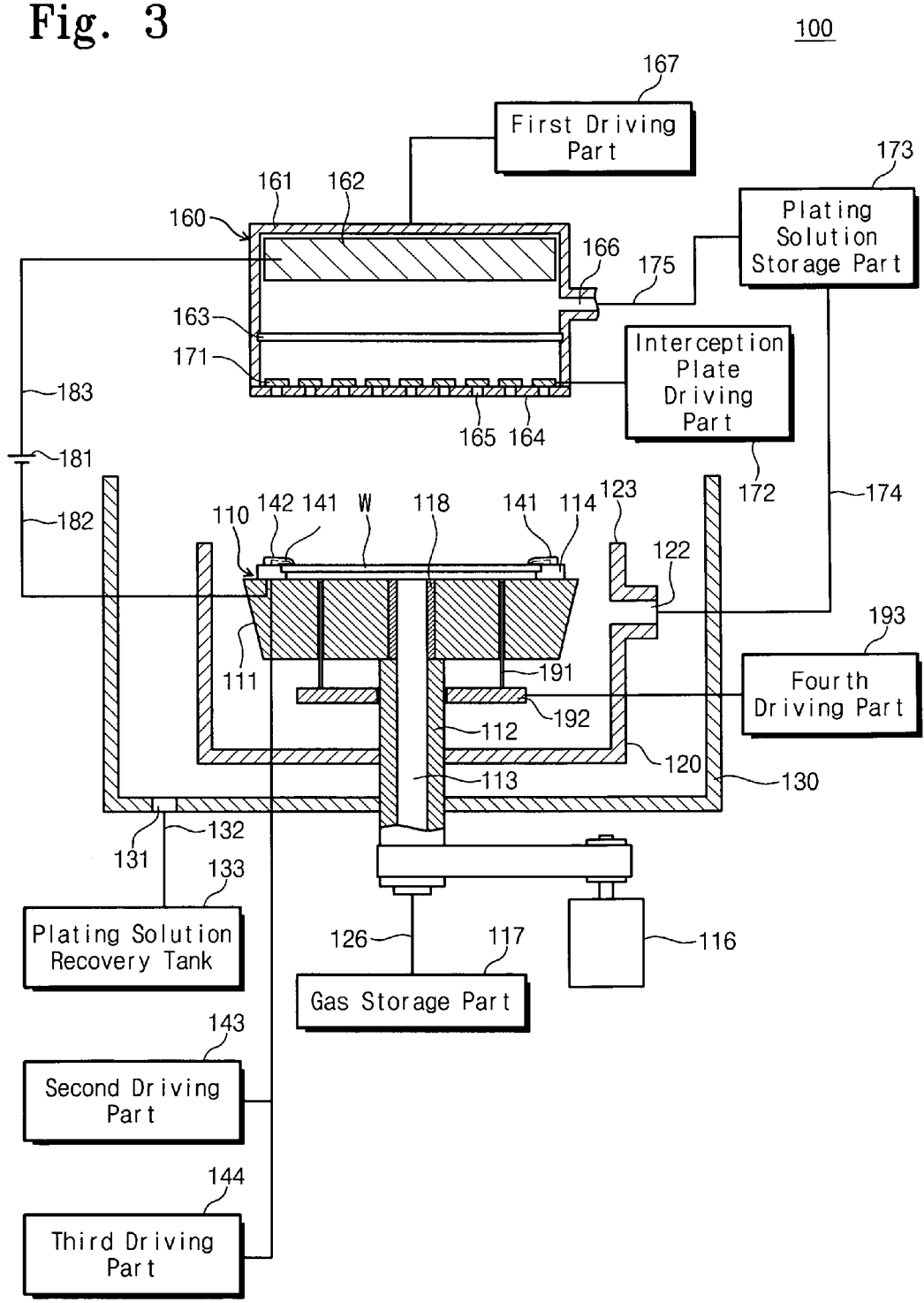
FIG. 3 is a sectional view of a substrate processing apparatus according to another embodiment of the inventive concept.

FIG. 3 is a sectional view of a substrate processing apparatus according to another embodiment of the inventive concept.

Referring to FIG. 3, a substrate processing apparatus 100 include a substrate support member 110, a plating bath 120, a bowl 130, and a plating solution supply member 160. Since the plating bath 120, the bowl 130, and the plating solution supply member 160 are the same constitution as those of FIG. 2A, their detailed descriptions will be omitted.

The substrate support member 110 includes a support plate 111, a support shaft 112, an annular ring 114, an injection nozzle 118, a metal pin 141, a reinforcement member 142, a support pin 191, and a base 192.

The support plate 111 has a circular plate shape. The support plate 111 has a top surface diameter greater than that of a supported substrate W and a bottom surface diameter less than the top surface diameter thereof.

The support shaft 112 is coupled to a lower end of the support plate 111. The support plate 111 is supported by the support shaft 112 and rotatable by rotation of the support shaft 112. The support plate 111 supports the substrate W to allow the plating surface of the substrate W to look up. The substrate W transferred by a transfer unit (not shown) in a state in which the plating surface looks up is seated on the support pin 191 that stays at an upper side of the support plate 111. Then, when the support pin 191 descends, the substrate W is supported by the support plate 111 to allow the plating surface to look up. The injection nozzle 118 passing through the support plate 111 is disposed in the support plate 111. The injection nozzle 118 supplies an inert gas to a non-plated surface of the substrate W. A plurality of holes vertically passing through the support plate is defined in the support plate 111. According to this embodiment, the plurality of holes is defined between the injection nozzle 118 and the annular ring 114. The plurality of holes serves as passages through which the support 191 ascends or descends.

The support shaft 112 has an inner passage 113 and vertically opened cylindrical shape. The support shaft 112 is coupled to a lower end of the support plate 111. The inner passage 113 of the support shaft 112 communicates with a gas supply line 126 and receives the inert gas from a gas storage part 117.

The annular ring 114 has a ring shape annularly protruding from a top surface of the support plate 111 to an upper side along an outer circumference of the support plate 111. The annular ring 114 provides a space in which the substrate W is disposed therein. The annular ring 114 allows the plating solution supplied from the plating solution supply member 160 to stay therein, thereby providing a space in which a plating layer is deposited.

The injection nozzle 118 passes through the top surface and a bottom surface of the support plate 111. The injection nozzle 118 is connected to the inner passage 113 of the support shaft 112 to inject the inert gas onto the non-plated surface of the substrate W. As the inert gas is injected, the substrate W is spaced apart from the top surface of the support plate 111. While the inert gas is injected onto the non-plated surface, since the metal pin 141 and the reinforcement member 142 support the planting surface, the substrate may be firmly supported.

Since the metal pin 141, the reinforcement member 142, the support pin 191, and the base 192 have the same constitution as those of FIG. 2A, their detailed descriptions will be omitted.

Figure 5A:
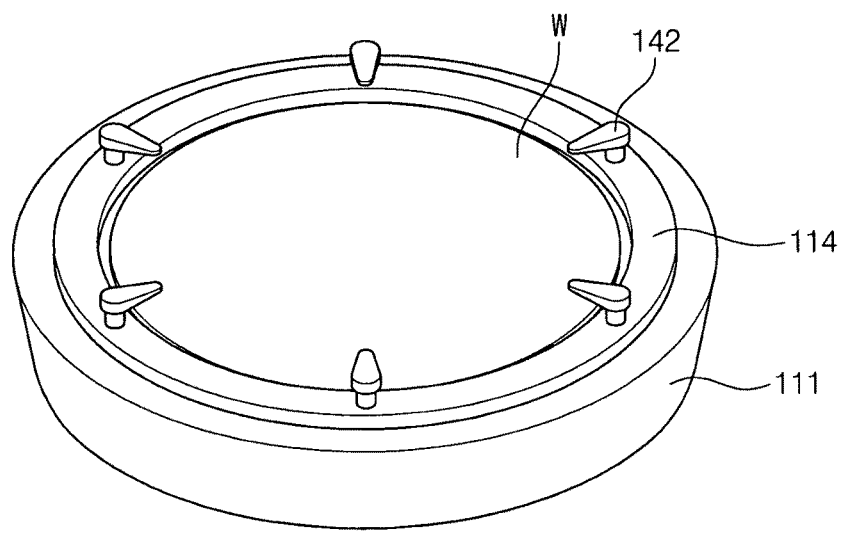
FIG. 5A is a perspective view of a substrate support member according to the inventive concept.
Figure 5B:
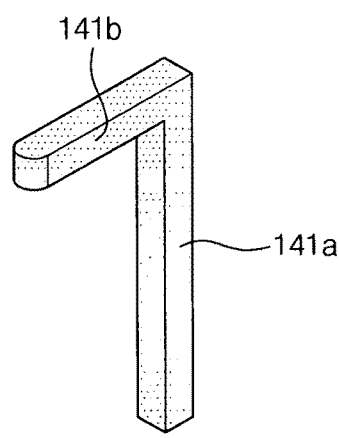
FIG. 5B is a perspective view of a metal pin according to the inventive concept.
Figure 5C:
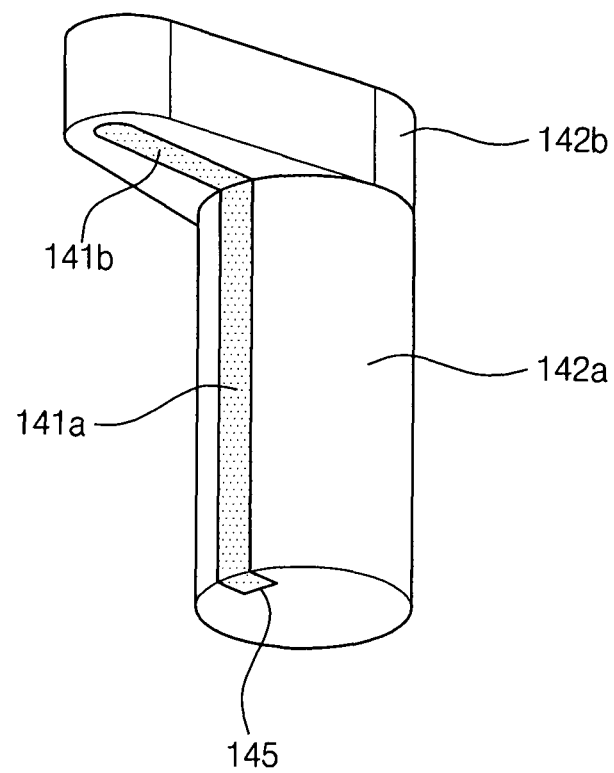
FIG. 5C is a perspective view of a metal pin and a reinforcement member according to the inventive concept.

FIG. 5A is a perspective view of a substrate support member according to the inventive concept. FIG. 5B is a perspective view of a metal pin according to the inventive concept. FIG. 5C is a perspective view of a metal pin and a reinforcement member according to the inventive concept.

Referring to FIG. 5A, a support plate 111 has a circular plate shape. An annular ring 114 is disposed on a top surface of the support plate 111. The annular ring 114 annularly protrudes from the top surface of the support plate 111 toward an upper side along an outer circumference of the support plate 111. A substrate W is disposed inside the annular ring 114 to allow a plating surface to look up. Also, the substrate W is supported by the support plate 111. A reinforcement member 142 is disposed at an upper end of the annular ring 114. The reinforcement member 142 may be provided in plurality. The plurality of reinforcement member 142 is spaced a predetermined distance from each other. The reinforcement member 142 protrudes upwardly from the upper end of the annular ring 114. An upper end of the reinforcement member 142 extends in a direction parallel to that of the top surface of the support plate 111. According to another embodiment, the reinforcement member 142 is disposed outside the annular ring 114.

Referring to FIG. 5B, the metal pin 141 includes an upwardly protruding support rod 141a and a contact rod 141b extending from an upper end of the support rod 141a to in a direction different from that of the support rod 141a. The metal pin 141 may be rotatable by a rotation of a driving part and ascend upwardly from an upper end of the annular ring 142.

Referring to FIG. 5C, the reinforcement member 142 includes a support member 142a protruding upwardly from the top surface of the support plate 111 and the upper member 142b extending from an end of the support member 142a in a direction different from that of the support member 142a. The groove 145 is longitudinally defined in a lateral surface of the reinforcement member 142. The groove 145 extends along a bottom surface of the upper member 142b. The metal pin 141 is inserted into the groove 145 defined in the outer surface of the reinforcement member 142. Specifically, the support rod 141a is inserted into the groove 145 defined in the support member 142a, and the contact rod 141b is inserted into the groove 145 defined in the upper member 142b. A surface of the metal pin 141 that does not contact the reinforcement member 142 is exposed to the outside.

Figure 6:
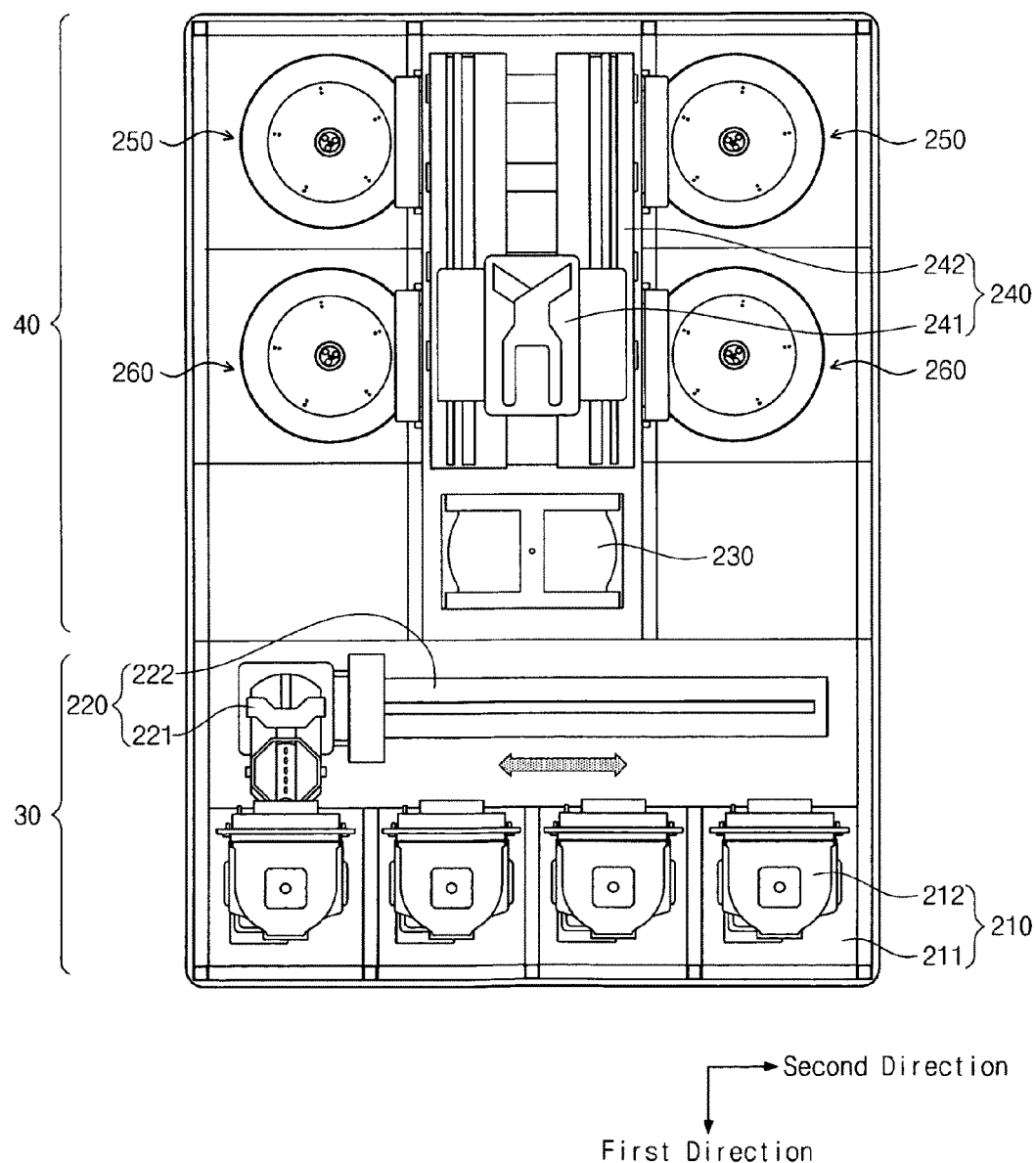
FIG. 6 is a schematic plan view of a substrate processing system according to an embodiment of the inventive concept.

FIG. 6 is a schematic plan view of a substrate processing system according to an embodiment of the inventive concept.

Referring to FIG. 6, a substrate processing system 200 includes an equipment front end module 30 and a process equipment 40.

The equipment front end module 30 is disposed at a front side of the process equipment 40 to transfer a substrate W between a carrier 210 in which the substrates W are received and the process equipment 40. The equipment front end module 30 includes a load/unload part 210 and a first transfer unit 220.

The load/unload part 210 is disposed at a front side of the first transfer unit 220 in a first direction. The load/unload part 210 includes a plurality of support parts 211 and a plurality of carriers 212. The support parts 211 are arranged in a line in a second direction perpendicular to the first direction. The carrier 212 receiving the substrate W to be processed land the completely processed substrate W) is seated on the support parts 211. The first transfer unit 220 is disposed between the load/unload part 210 and the process equipment 40. The first transfer unit 220 includes a first transfer robot 221. The first transfer robot 221 transfers the substrate W between the carrier 212 and the process equipment 40 along a transfer rail 222 disposed in the second direction.

The process equipment 40 includes a buffer part 230, a second transfer unit 230, a substrate plating chamber 240, and a substrate cleaning chamber 260. The buffer part 230 is disposed at a front side of the process equipment 40 in the first direction. The buffer part 230 provides a space in which the substrate W to be processed and the completely processed substrate W stay before they are not transferred. The second transfer unit 240 is disposed at a rear side of the buffer part 230. The second transfer unit 240 includes a second transfer robot 241 moved along a transfer rail 242 disposed within the process equipment 40 in the first direction. The plurality of substrate cleaning chambers 260 and substrate plating chambers 250 are disposed at both sides of the transfer rail 242 in the first direction. The substrate cleaning chambers 260 and the substrate plating chambers 250 are disposed in the second direction to face each other with the transfer rail 242 therebetween. A plating layer is formed on the plating surface of the substrate W in the substrate plating chamber 250. The completely plated substrate W is cleaned and dried in the substrate cleaning chamber 260. A series of processes for processing the substrate W in the substrate processing system 200 is as follows: The substrate W received in the carrier 212 is transferred to the buffer part 230 by the first transfer robot 221. The second transfer robot 241 loads the substrate W to allow the plating surface of the substrate W received in the buffer part 230 to look up. Then, the second transfer robot 241 transfers the substrate W into the substrate plating chamber 250 to seat the substrate W in a state the plating surface looks up. As described above, the second transfer robot 241 transfers the substrate W to the substrate plating chamber 250 in the state where the plating surface of the substrate W looks up. Then, the second transfer robot 241 seats the substrate W on the substrate support member 110 without reversing the substrate W. When the plating process is completely performed, the second transfer robot 241 loads the substrate W on the substrate support member 110 to transfer the substrate W into the substrate cleaning chamber 260. When the cleaning and drying processes of the substrate W are completely performed in the substrate cleaning chamber 260, the second transfer robot 241 transfers the substrate W to the buffer part 230. The first transfer robot 221 loads the substrate W to the buffer part 230 and receives the loaded substrate W into the carrier 212.

FIGS. 7A to 7D are views of a substrate processing method according to an embodiment of the inventive concept.

Figure 7A:
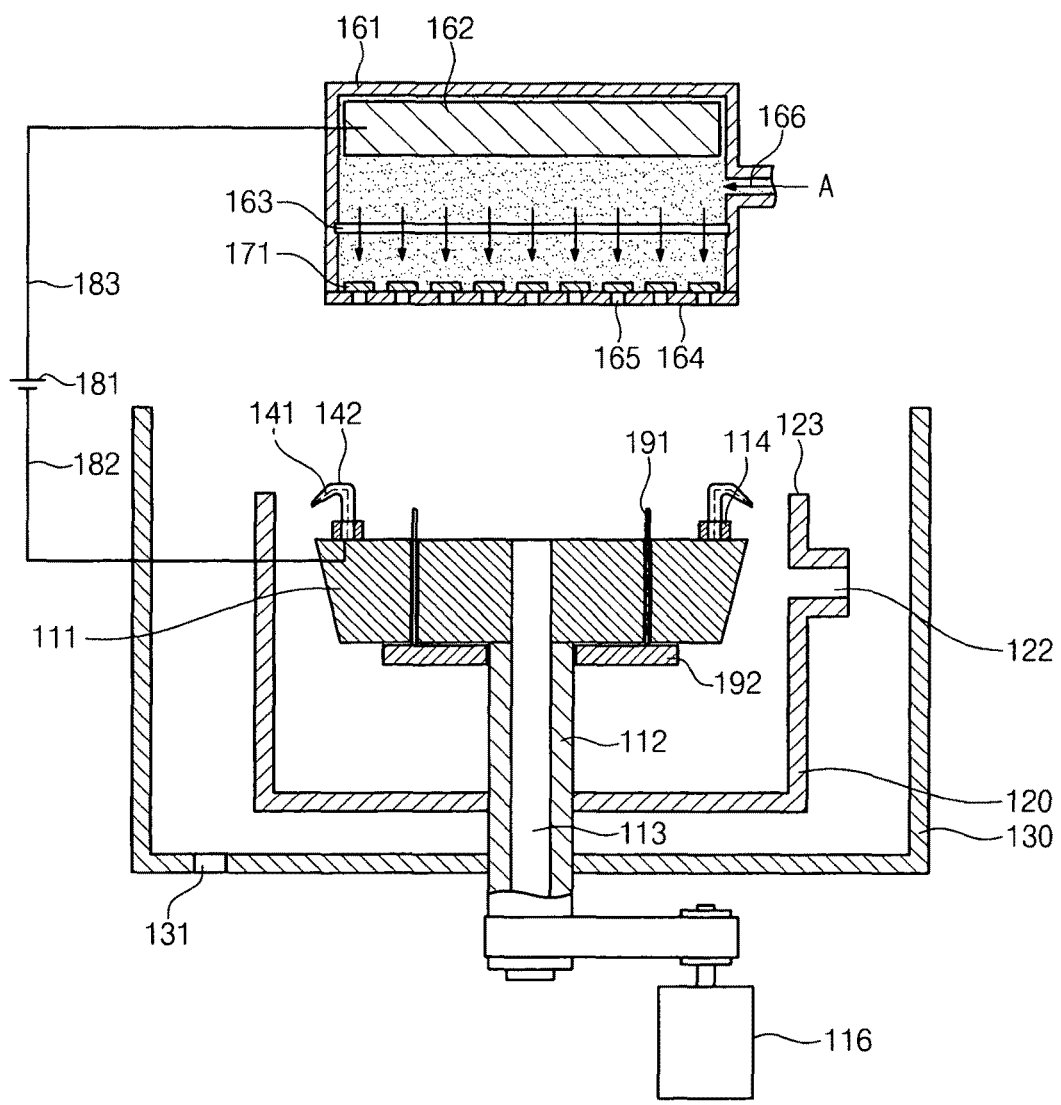
FIGS. 7A to 7D are views of a substrate processing method according to an embodiment of the inventive concept.

Referring to FIG. 7A, according to a substrate processing method, a plating solution A is supplied into an inner space of a plating solution supply member 160. The plating solution A stored in a plating solution storage part (not shown) is supplied into the inner space of the plating solution supply member 160 through a second supply line (not shown) and a second inflow hole 166. Specifically, the plating solution A is supplied into a space between a positive electrode 162 and an ion exchange membrane 163. When a predetermined voltage is applied to the positive electrode 162 by a power source 181, positive ions such as $Cu^{2+}$ are emitted from the positive electrode 162 into the plating solution A. The $Cu^{2+}$ positive ions emitted from the positive electrode 162 pass through the ion exchange membrane 163. However, $SO_4^{2-}$ negative ions remaining in the plating solution A does not pass through the ion exchange membrane 163. A metal pin 141 is rotated by an operation of a second driving part 143 to allow a contact rod 141a to face the outside of a support plate 111. Also, the metal pin 141 ascends upwardly from a top surface of the support plate 111 by an operation of a third driving part 144. An upper end of a support pin 191 is disposed above the support plate 111 due to ascent of a base 192.

Figure 7B:
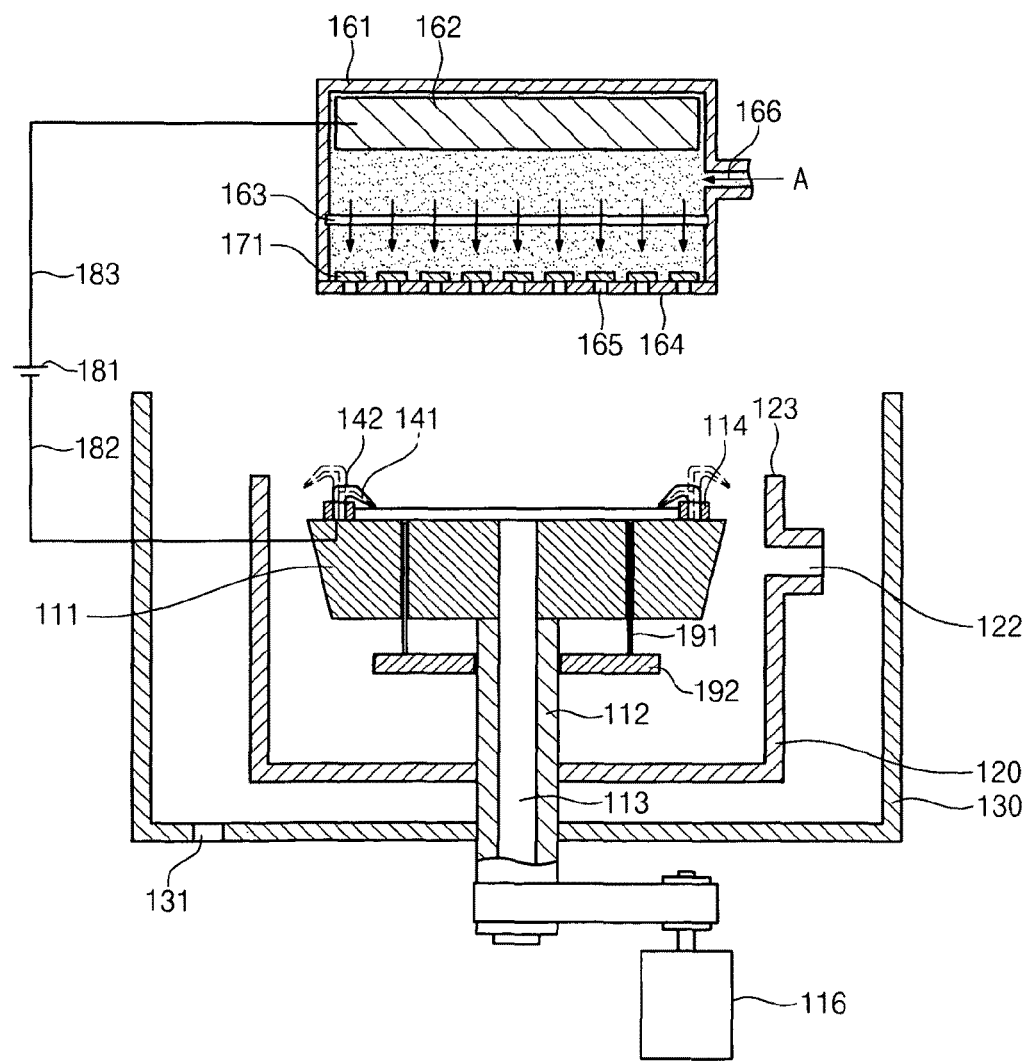

Referring to FIG. 7B, a second transfer unit (see reference numeral 241 of FIG. 6) transfers a substrate W into a substrate plating chamber 250 in a state where the plating surface looks up to seat the substrate W on the support pin 191. The support pin 192 descends in a state where it supports the substrate W. Then, the substrate W is supported by the support plate 111. When the substrate W is supported by the support plate 111, the metal pin 141 is rotated and descends to allow a contact rod 141a to contact the plating surface of the substrate W. According to this embodiment, an inert gas is injected onto a non-plated surface of the substrate W to space the substrate W from a top surface of the support plate 111. Since the plating surface is supported by the metal pin 141 and the reinforcement member 142 and the inert gas is injected onto the non-plated surface, the substrate W may be firmly supported to prevent the plating solution from being introduced onto the non-plated surface.

Figure 7C:
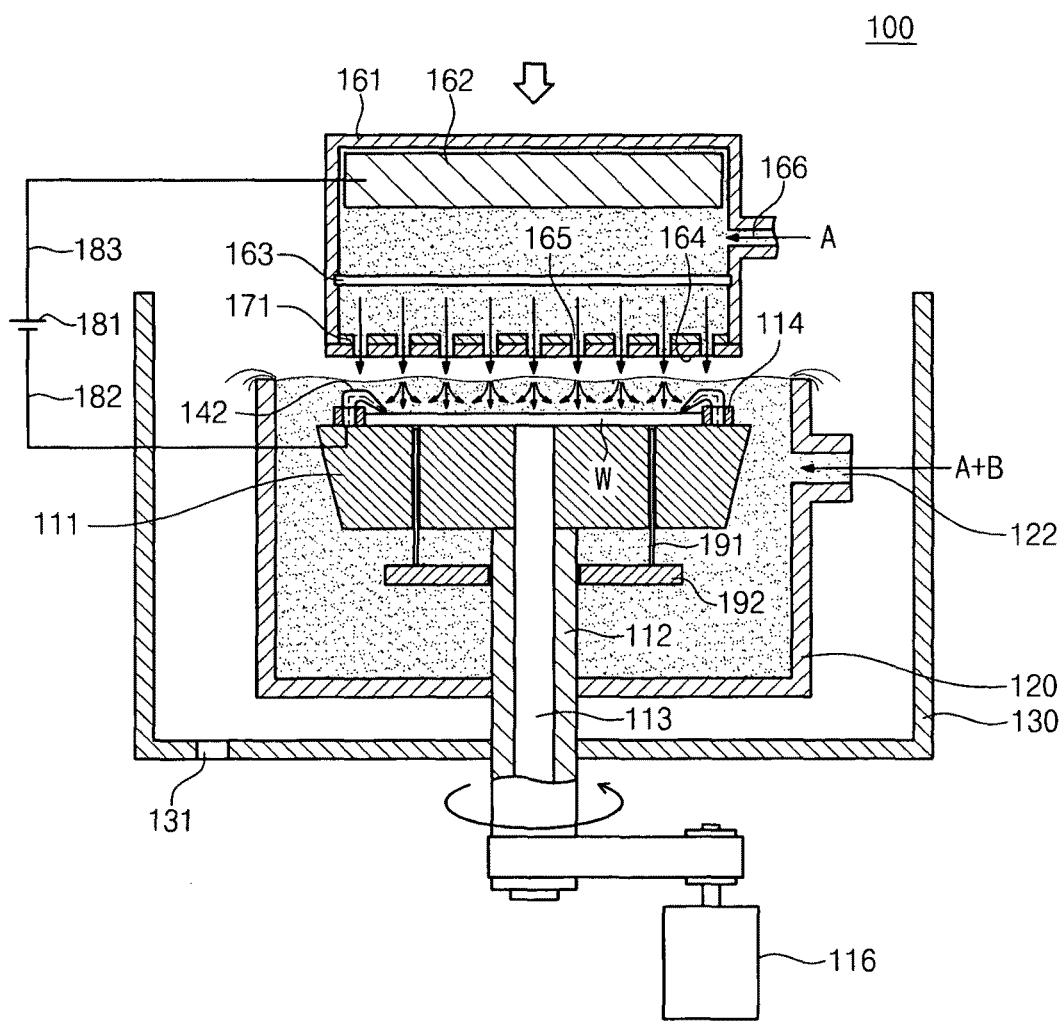

Referring to FIG. 7C, according to the substrate processing method, the plating solution A is discharged from the plating solution supply member 160 disposed above the substrate support member 110 onto the plating surface. While the plating solution is discharged onto the plating surface, the substrate support member 110 is rotated. When a certain amount of the plating solution A is supplied into an inner space of the plating solution supply member 160, the plating solution supply member 160 discharge the plating solution A onto the plating surface. In case where the plating solution A is discharged after it temporarily stays within the inner space of the plating solution supply member 160, the $Cu^{2+}$ positive ions are sufficiently dissolved from the positive electrode 162 during the staying time of the plating solution A to uniformly supply the plating solution A on an entire surface of the substrate W. As a result, a plating layer is uniformly formed on the entire surface of the substrate W. On the other hand, in case where the supplied plating solution A is directly discharged onto the substrate W without staying within the inner space, the plating solution A is not simultaneously supplied onto the entire surface of the substrate W. Also, since the $Cu^{2+}$ positive ions are not sufficiently supplied from the positive electrode 162, the plating layer is not uniformly formed on the entire surface of the substrate W.

When the plating solution A is fully filled into the inner space of the plating solution supply member 160, the plating solution supply member 160 descends or the substrate support member 110 ascends to reduce a distance between the plating solution supply part 160 and the substrate support member 110. When the plating solution supply member 160 is close to the substrate support member 110, a plurality of holes 165 formed in a porous plate 164 is opened to discharge the plating solution A onto the plating surface. Since the plating solution A is discharged through the plurality of uniformly arranged holes 165, the plating solution A may be uniformly provided onto the entire surface of the substrate W. The discharged plating solution A is maintained by an annular ring 114 and overflows at an upper end of the annular ring 114. The plating solution A maintained by the annular ring 114 contains a large amount of the $Cu^{2+}$ positive ions, the plating layer may be uniformly deposited.

The discharged plating solution A contains the $Cu^{2+}$ positive ions dissolved from a Cu plate 162 and passing through the ion exchange membrane 163. While the plating solution is discharged onto the plating surface of the substrate W, the substrate support member 110 is rotated. The discharged plating solution A is uniformly supplied onto the entire surface of the substrate W by the rotation of the substrate support member 110. The $Cu^{2+}$ positive ions form a Cu plating layer on the plating surface of the substrate W. When the plating solution A is discharged onto the plating surface of the substrate W, the plating solution A and an additive B are supplied into a plating bath 120. The substrate support member 110 is immersed into the plating solution A and the additive B and then rotated. At this time, since the substrate W is immersed within the plating solution, the discharged plating solution is not directly supplied to the substrate W, but is mixed with the plating solution immersing the substrate W and indirectly supplied to the plating surface. Thus, stress applied to a pattern of the substrate W may be reduced. Also, since the $Cu^{2+}$ positive ions are diffused into the plating solution immersing the substrate W and thus uniformly supplied to the entire surface of the substrate W, the plating layer may be uniformly deposited.

The plating solution A is supplied into the plating bath 120 from the plating solution storage part 173 through a first supply line 174 and a first inflow hole 122. The supplied plating solution A overflows from the plating bath 120. Also, the plating solution A is dispersed by the rotation of the substrate support member 110. The overflowing and dispersed plating solution is recovered into a bowl 130. The additive B may include a sulfurous compound, a polymer, and a nitrogen compound. Here, the sulfurous compound grows crystal nucleus over the entire plated surface to promote accumulation of finer particles. The polymer increases an overvoltage at the Cu accumulation to increase electrodeposition. The nitrogen compound adheres to a protrusion having a thicker plating thickness to increase overvoltage at a protrusion and interrupt the Cu accumulation, thereby planarizing the plated layer.

Figure 7D:
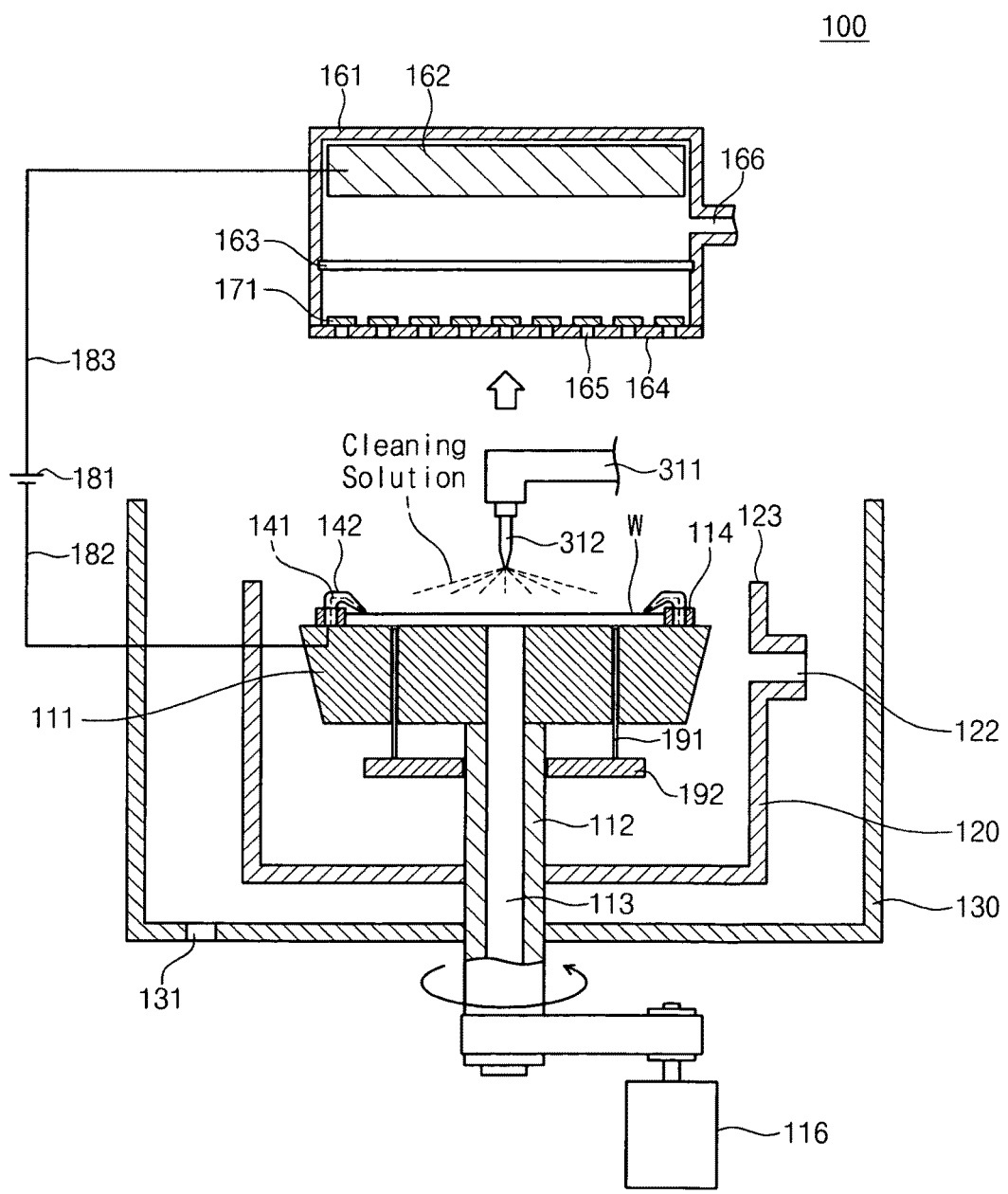

Referring to FIG. 7D, when the substrate plating process is completely performed, the plating solution A is not supplied to the plating solution supply member 160 and the substrate support member 110. Also the holes 165 of the porous plate 164 are intercepted. The plating solution supply member 160 ascends or the substrate support member 110 descends, resulting in a relatively large distance between the plating solution supply member 160 and the substrate support member 110. Thereafter, a cleaning part 311 including a cleaning nozzle 312 is disposed above the substrate W to inject a cleaning solution onto the substrate W in which the plating process is completely performed, thereby cleaning the plated surface.

According to the inventive concept, the plating layer can be uniformly deposited on the plating surface of the substrate.

Also, since the plating surface of the substrate is supported to look up, the plating process can be performed without reversing the substrate.

Also, since a unit for reversing the substrate is not required, the substrate plating apparatus can have a simple structure.

Also, since the bubbles generated during the plating process does not stay within the pattern, the plating defect due to the bubbles can be prevented.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An apparatus for plating a substrate, comprising:
   a substrate support member;
   a plating solution supply member disposed above the substrate support member, the plating solution supply member discharging a plating solution onto a plating surface of the substrate, the plating solution supply member includes:
     an enclosure having an inner space with opened lower portion and a fluid inlet;
     a positive electrode disposed in the inner space, the positive electrode providing positive ions into the plating solution; and
     an ion exchange membrane disposed below the positive electrode and above the opened lower portion, the ion exchange membrane being permeable only to the positive ions;
   a plating bath configured to receive the plating solution and immerse the substrate support member thereof; and
   a bowl configured to completely surround the plating bath and recover the plating solution overflowing from the plating bath,
   wherein the substrate support member includes a support plate to support the substrate and allow the plating solution to be applied onto the plating surface of the substrate.

2. The apparatus of claim 1, wherein the substrate support member comprises an annular ring protruding annularly from a top surface of the support plate toward an upper side along an outer circumference of the support plate, the annular ring providing a space in which the substrate is disposed therein.

3. The apparatus of claim 2, wherein the substrate support member further comprises an injection nozzle passing through the support plate and injecting an inert gas onto a non-plated surface of the substrate.

4. The apparatus of claim 2, wherein the support plate has a vacuum suction hole vacuum-adsorbing a non-plated surface of the substrate to support the substrate.

5. The apparatus of claim 2, wherein the substrate support member has a holes vertically passing through the support plate and further comprises a support pin vertically movable along the respective holes and loading/unloading the substrate to/in the space.

6. The apparatus of claim 2, wherein the plating bath surrounds the substrate support member, has an opened upper portion, and has an upper end higher than a top surface of the annular ring.

7. The apparatus of claim 6, further comprising:
   a plating solution storage part storing the plating solution;
   a first supply line connecting the plating solution supply member to the plating solution storage part, the first supply line supplying the plating solution to the plating solution supply member; and
   a second supply line connecting the plating bath to the plating solution storage part, the second supply line supplying the plating solution to the plating bath.

8. The apparatus of claim 2, wherein the plating solution supply member has a bottom surface having a diameter greater than an inner diameter of the annular ring.

9. The apparatus of claim 1, further comprising a porous plate in which a plurality of holes is defined, the porous plate is disposed below the ion exchange membrane.

10. The apparatus of claim 1, further comprising a first driving part vertically moving the substrate support member or the plating solution supply member, the first driving part varying a relative distance between the substrate support member and the plating solution supply member.

11. The apparatus of claim 9, wherein the plating solution supply member further comprises an interception plate for opening and closing the plurality of holes of the porous plate.

12. The apparatus of claim 1, wherein the substrate support member further comprises a metal pin disposed on an outer circumference of the support plate, the metal pin protruding upwardly from a top surface of the support plate,
   wherein the metal pin contacts the plating surface and is electrically connected to the substrate.

13. The apparatus of claim 2, wherein the substrate support member further comprises a metal pin disposed on the outer circumference of the support plate, the metal pin protruding upwardly from the top surface of the support plate,
   wherein the metal pin contacts the plating surface and is electrically connected to the substrate.

14. The apparatus of claim 13, wherein the metal pin is disposed on the annular ring.

15. The apparatus of claim 14, wherein the substrate support member further comprises a reinforcement member surrounding an outer surface of the metal pin, the reinforcement member reinforcing strength of the metal pin.

16. The apparatus of claim 15, wherein the reinforcement member comprises a support member comprising a support member protruding upwardly from the top surface of the support plate and an upper member extending from an end of the support member in a direction different from that of the support member,
   wherein a groove is defined in a lateral surface of the support member in a longitudinal direction, and the groove extends along a bottom surface of the upper member,
   wherein the metal pin is inserted into the groove.

17. The apparatus of claim 14, further comprising a second driving part rotating the metal pin.

18. The apparatus of claim 17, further comprising a third driving part lifting the meal pin from the top surface of the support plate toward an upper side.

* * * * *